US006269135B1

(12) United States Patent
Sander

(10) Patent No.: US 6,269,135 B1
(45) Date of Patent: Jul. 31, 2001

(54) DIGITAL PHASE DISCRIMINATIONS BASED ON FREQUENCY SAMPLING

(75) Inventor: Wendell Sander, Los Gatos, CA (US)

(73) Assignee: Tropian, Inc., Cupertino, CA (US)

( * ) Notice: Subject to any disclaimer, the term of this patent is extended or adjusted under 35 U.S.C. 154(b) by 0 days.

(21) Appl. No.: 09/006,938

(22) Filed: Jan. 14, 1998

(51) Int. Cl.[7] .................................................. H04L 7/00
(52) U.S. Cl. .......................................... 375/354; 375/371
(58) Field of Search ..................................... 375/354, 377, 375/375, 355, 371; 327/144, 151, 3

(56) References Cited

U.S. PATENT DOCUMENTS

| | | | | |
|---|---|---|---|---|
| 4,527,145 | * | 7/1985 | Haussmann et al. | 358/19 |
| 4,764,923 | * | 8/1988 | Forth et al. | 371/6 |
| 5,084,669 | | 1/1992 | Dent | 324/83 |
| 5,272,391 | * | 12/1993 | Ampe et al. | 307/269 |
| 5,319,369 | * | 6/1994 | Majos et al. | 341/1 |
| 5,341,136 | * | 8/1994 | Przybysz et al. | . |
| 5,513,209 | * | 4/1996 | Holm | 375/354 |
| 5,557,647 | * | 9/1996 | Kushige et al. | 375/371 |
| 5,703,502 | * | 12/1997 | Grewal et al. | 327/3 |

OTHER PUBLICATIONS

Beards, R. Douglas et al., "An Oversampling Delta–Sigma Frequency Discriminator", *IEEE Transactions on Circuits and Systems—II: Analog and Digital Signal Processing*, vol. 41–1 (1994).

Candy, James C. et al., "Oversampling Methods for A/D and D/A Conversion", *IEEE Circuits and Systems Society—Oversampling Delta–Sigma Data Converters: Theory, Design, and Simulation*, Selected Reprint Volume, pp 1–6 (1991).
Hovin et al., "Delta–Sigma Modulators Using Frequency–Modulated Intermediate Values", *IEEE Journal of Solid–State Circuits*, 32:1, pp. 13–22 (1997).
Hovin et al. "A Narrow–Band Delta–Sigma Frequency–to–Digital Converter", *IEEE International Symposium on circuits and Systems*, pp. 77–80 (1997).
Hovin et al., "Novel second–order Δ–Σ modulator/frequency–to–digital converter", *Electronics Letters*, 31:2, pp. 81–82 (1995).

* cited by examiner

*Primary Examiner*—Chi Pham
*Assistant Examiner*—Jean B. Corrielus

(57) ABSTRACT

The present invention, generally speaking, provides a simple, all-digital method and apparatus for determining the phase of a first clock signal relative to a second clock signal. The first clock signal may be a digital approximation of a periodic analog signal such as an RF signal. A sampling technique is employed that produces a stream of digital bits containing relative phase information. From the stream of digital bits is formed a digital word indicative of the relative phase. The digital word may be formed using a digital filter. Advantageously, an extensive body of digital filtering techniques applicable to Sigma-Delta (sometimes referred to as Delta-Sigma) A/D converters may be applied directly to the digital stream. By using an appropriately-chosen weighting function, high accuracy may be obtained.

17 Claims, 22 Drawing Sheets

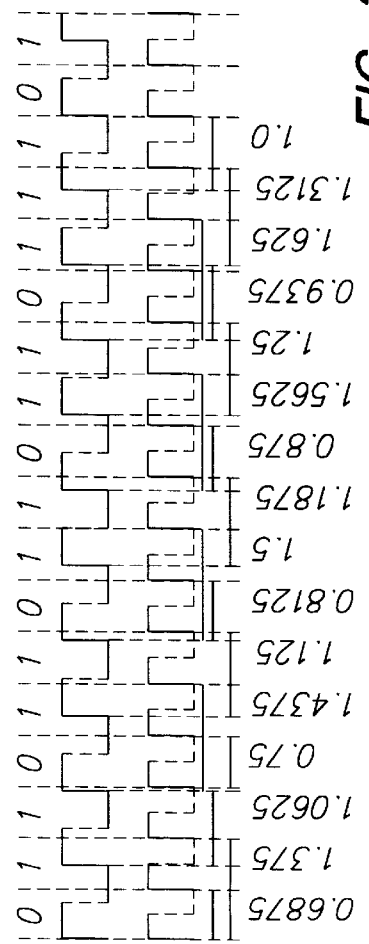
*FIG. 2*
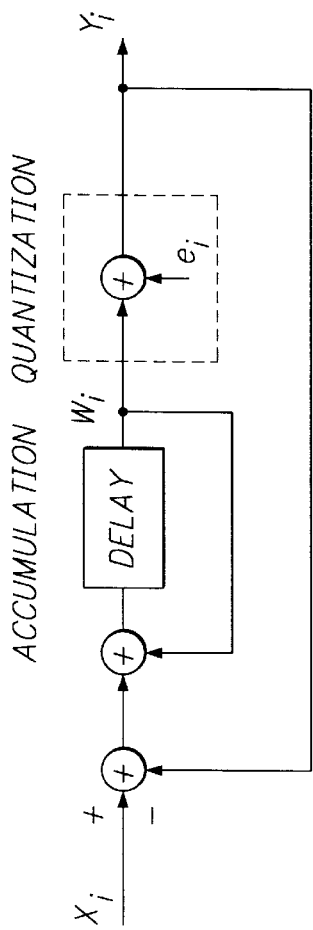
*FIG. 1*
*FIG. 3*

FIG. 11A-1

| Observed Frequency Data Stream X | Weight W | Fr Ratio = Reference Frequency/ Sample Frequency = |
|---|---|---|
| 1 | 1 | 0.6875 |
| 1 | 2 | |
| 0 | 3 | |
| 1 | 4 | |
| 1 | 5 | |
| 0 | 6 | |
| 1 | 7 | |
| 1 | 8 | |
| 0 | 9 | |
| 1 | 10 | |
| 1 | 11 | |
| 1 | 12 | |
| 0 | 13 | |
| 1 | 14 | |
| 1 | 15 | |
| 0 | 16 | |
| 1 | 17 | |
| 1 | 18 | |
| 0 | 19 | |
| 1 | 20 | |
| 1 | 21 | |
| 0 | 22 | |
| 1 | 23 | |
| 1 | 24 | |
| 0 | 25 | |
| 1 | 26 | |
| 1 | 27 | |
| 1 | 28 | |
| 0 | 29 | |
| 1 | 30 | |
| 1 | 31 | |
| 0 | 32 | |
| 1 | 33 | |
| 1 | 34 | |
| 0 | 35 | |
| 1 | 36 | |
| 1 | 37 | |
| 0 | 38 | |
| 1 | 39 | |
| 1 | 40 | |
| 0 | 41 | |
| 1 | 42 | |
| 1 | 43 | |

| |
|---|
| FIG. 11A-1 |
| FIG. 11A-2 |

FIG. 11A

| | |
|---|---|
| 0 | 44 |
| 1 | 45 |
| 1 | 46 |
| 1 | 47 |
| 0 | 48 |
| 1 | 49 |
| 1 | 50 |
| 0 | 51 |
| 1 | 52 |
| 1 | 53 |
| 0 | 54 |
| 1 | 55 |
| 1 | 56 |
| 0 | 57 |
| 1 | 58 |
| 1 | 59 |
| 0 | 60 |
| 1 | 61 |
| 1 | 62 |
| 1 | 63 |
| 0 | 64 |
| 1 | 64 |
| 1 | 63 |
| 0 | 62 |
| 1 | 61 |
| 1 | 60 |
| 0 | 59 |
| 1 | 58 |

| Correct Phase | Frequency Estimate | | Integration |
|---|---|---|---|
| | $F_n = \sum_i (W_i * X_{i+n})$  $F$ | $\Delta F_i = F_i - Fr$ Ratio  $\Delta F$ | $PF_n = PF_{n-1} * k * \Delta F_i$  $Pf$ |
| −53.714763 | 0.686058 | −0.001442 | −55.876923 |
| −54.394811 | 0.686058 | −0.001442 | −56.615385 |
| −55.066978 | 0.686058 | −0.001442 | −57.353846 |
| −55.731139 | 0.686058 | −0.001442 | −58.092308 |
| −56.387171 | 0.686058 | −0.001442 | −58.830769 |
| −57.034949 | 0.686058 | −0.001442 | −59.569231 |
| −57.674350 | 0.686058 | −0.001442 | −60.307692 |

FIG. 11A-2

Ave Error=1.501453

| Observed Frequency Data Stream X | Weight W | $Y_i = X_i - \text{FrRatio}$ Y | $PX_i = PX_{i-1} + Y_i$ Px | Fr Ratio = Reference Frequency/ Sample Frequency = 0.6875 |
|---|---|---|---|---|
| 1 | 1 | 0.3125 | 0.0000 | |
| 1 | 2 | 0.3125 | 0.3125 | |
| 0 | 3 | −0.6875 | −0.3750 | FIG. 12A-1 |
| 1 | 4 | 0.3125 | −0.0625 | |
| 1 | 5 | 0.3125 | 0.2500 | |
| 0 | 6 | −0.6875 | −0.4375 | |
| 1 | 7 | 0.3125 | −0.1250 | |
| 1 | 8 | 0.3125 | 0.1875 | |
| 0 | 9 | −0.6875 | −0.5000 | |
| 1 | 10 | 0.3125 | −0.1875 | |
| 1 | 11 | 0.3125 | 0.1250 | |
| 1 | 12 | 0.3125 | 0.4375 | |
| 0 | 13 | −0.6875 | −0.2500 | |
| 1 | 14 | 0.3125 | 0.0625 | |
| 1 | 15 | 0.3125 | 0.3750 | |
| 0 | 16 | −0.6875 | −0.3125 | |
| 1 | 17 | 0.3125 | 0.0000 | |
| 1 | 18 | 0.3125 | 0.3125 | FIG. 12A-1 |
| 0 | 19 | −0.6875 | −0.3750 | |
| 1 | 20 | 0.3125 | −0.0625 | |
| 1 | 21 | 0.3125 | 0.2500 | |
| 0 | 22 | −0.6875 | −0.4375 | |
| 1 | 23 | 0.3125 | −0.1250 | |
| 1 | 24 | 0.3125 | 0.1875 | |
| 0 | 25 | −0.6875 | −0.5000 | |
| 1 | 26 | 0.3125 | −0.1875 | |
| 1 | 27 | 0.3125 | 0.1250 | |
| 1 | 28 | 0.3125 | 0.4375 | FIG. 12A-2 |
| 0 | 29 | −0.6875 | −0.2500 | |
| 1 | 30 | 0.3125 | 0.0625 | |
| 1 | 31 | 0.3125 | 0.3750 | |
| 0 | 32 | −0.6875 | −0.3125 | |
| 1 | 33 | 0.3125 | 0.0000 | |
| 1 | 34 | 0.3125 | 0.3125 | |
| 0 | 35 | −0.6875 | −0.3750 | FIG. 12A |
| 1 | 36 | 0.3125 | −0.0625 | |
| 1 | 37 | 0.3125 | 0.2500 | |
| 0 | 38 | −0.6875 | −0.4375 | |
| 1 | 39 | 0.3125 | −0.1250 | |
| 1 | 40 | 0.3125 | 0.1875 | |
| 0 | 41 | −0.6875 | −0.5000 | |
| 1 | 42 | 0.3125 | −0.1875 | |
| 1 | 43 | 0.3125 | 0.1250 | |

| | | | | | |
|---|---|---|---|---|---|
| 0 | 44 | −0.6875 | −0.5625 | | |
| 1 | 45 | 0.3125 | −0.2500 | | |
| 1 | 46 | 0.3125 | 0.0625 | | |
| 1 | 47 | 0.3125 | 0.3750 | | |
| 0 | 48 | −0.6875 | −0.3125 | | |
| 1 | 49 | 0.3125 | 0.0000 | | |
| 1 | 50 | 0.3125 | 0.3125 | | |
| 0 | 51 | −0.6875 | −0.3750 | | |
| 1 | 52 | 0.3125 | −0.0625 | | |
| 1 | 53 | 0.3125 | 0.2500 | | |
| 0 | 54 | −0.6875 | −0.4375 | | |
| 1 | 55 | 0.3125 | −0.1250 | | |
| 1 | 56 | 0.3125 | 0.1875 | | |
| 0 | 57 | −0.6875 | −0.5000 | | |
| 1 | 58 | 0.3125 | −0.1875 | | |
| 1 | 59 | 0.3125 | 0.1250 | | |
| 0 | 60 | −0.6875 | −0.5625 | | |
| 1 | 61 | 0.3125 | −0.2500 | Correct Phase | $PP_n =$ $k*\sum_i (W_i + PX_{i+n})$ PP |
| 1 | 62 | 0.3125 | 0.0625 | | |
| 1 | 63 | 0.3125 | 0.3750 | | |
| 0 | 64 | −0.6875 | −0.3125 | | |
| 1 | 64 | 0.3125 | 0.0000 | −53.714763 | −55.876923 |
| 1 | 63 | 0.3125 | 0.3125 | −54.394811 | −56.615385 |
| 0 | 62 | −0.6875 | −0.3750 | −55.066976 | −57.353846 |
| 1 | 61 | 0.3125 | −0.0625 | −55.731139 | −58.092308 |
| 1 | 60 | 0.3125 | 0.2500 | −56.387171 | −58.830769 |
| 0 | 59 | −0.6875 | −0.4376 | −57.034949 | −59.569231 |
| 1 | 58 | 0.3125 | −0.1250 | −57.674350 | −60.307692 |

FIG. 12A-2

Ave Error= 1.501453

| Reference Frequency Data Stream R | Observed Frequency Data System X | $D_i = D_{i-1} + X_i - R_i$ | Weight W | Fr Ratio= Reference Frequency/ Sample Frequency = 0.6875 |
|---|---|---|---|---|
| 1 | 1 | 0 | 1 | |
| 1 | 1 | 0 | 2 | |
| 0 | 0 | 0 | 3 | |
| 1 | 1 | 0 | 4 | |
| 1 | 1 | 0 | 5 | |
| 0 | 0 | 0 | 6 | |
| 1 | 1 | 0 | 7 | |
| 1 | 1 | 0 | 8 | |
| 1 | 0 | -1 | 9 | |
| 0 | 1 | 0 | 10 | |
| 1 | 1 | 0 | 11 | |
| 1 | 1 | 0 | 12 | |
| 0 | 0 | 0 | 13 | |
| 1 | 1 | 0 | 14 | |
| 1 | 1 | 0 | 15 | |
| 0 | 0 | 0 | 16 | |
| 1 | 1 | 0 | 17 | |
| 1 | 1 | 0 | 18 | |
| 0 | 0 | 0 | 19 | |
| 1 | 1 | 0 | 20 | |
| 1 | 1 | 0 | 21 | |
| 0 | 0 | 0 | 22 | |
| 1 | 1 | 0 | 23 | |
| 1 | 1 | 0 | 24 | |
| 1 | 0 | -1 | 25 | |
| 0 | 1 | 0 | 26 | |
| 1 | 1 | 0 | 27 | |
| 1 | 1 | 0 | 28 | |
| 0 | 0 | 0 | 29 | |
| 1 | 1 | 0 | 30 | |
| 1 | 1 | 0 | 31 | |
| 0 | 0 | 0 | 32 | |
| 1 | 1 | 0 | 33 | |
| 1 | 1 | 0 | 34 | |
| 0 | 0 | 0 | 35 | |
| 1 | 1 | 0 | 36 | |
| 1 | 1 | 0 | 37 | |
| 0 | 0 | 0 | 38 | |
| 1 | 1 | 0 | 39 | |
| 1 | 1 | 0 | 40 | |
| 1 | 0 | -1 | 41 | |
| 0 | 1 | 0 | 42 | |

| | | | | | |
|---|---|---|---|---|---|
| 1 | 1 | 0 | 43 | | |
| 1 | 0 | -1 | 44 | | |
| 0 | 1 | 0 | 45 | | |
| 1 | 1 | 0 | 46 | | |
| 1 | 1 | 0 | 47 | | |
| 0 | 0 | 0 | 48 | | |
| 1 | 1 | 0 | 49 | | |
| 1 | 1 | 0 | 50 | | |
| 0 | 0 | 0 | 51 | | |
| 1 | 1 | 0 | 52 | | |
| 1 | 1 | 0 | 53 | | |
| 0 | 0 | 0 | 54 | | |
| 1 | 1 | 0 | 55 | | |
| 1 | 1 | 0 | 56 | | |
| 1 | 0 | -1 | 57 | | |
| 0 | 1 | 0 | 58 | | |
| 1 | 1 | 0 | 59 | | |
| 1 | 0 | -1 | 60 | | $k_0 = 16$ |
| 0 | 1 | 0 | 61 | | $PI_n =$ |
| 1 | 1 | 0 | 62 | | $k_0 + k_1 * \sum_i (W_i * D_{i+n})$ |
| 1 | 1 | 0 | 63 | | F |
| 0 | 0 | 0 | 64 | Correct Phase | |
| 1 | 1 | 0 | 64 | -53.714763 | -55.876923 |
| 1 | 1 | 0 | 63 | -54.394811 | -56.615385 |
| 0 | 0 | 0 | 62 | -55.066978 | -57.353846 |
| 1 | 1 | 0 | 61 | -55.731139 | -58.092308 |
| 1 | 1 | 0 | 60 | -56.387171 | -58.830769 |
| 0 | 0 | 0 | 59 | -57.034949 | -59.569231 |
| 1 | 1 | 0 | 58 | -57.674350 | -60.307692 |

FIG. 14A-2

Ave Error= 1.501453

| Reference Frequency Generator RG | Reference Frequency Data Stream R | Observed Frequency Data System X | $D_i = D_{i-1}+X_i-R_i$ D | Weight W | Fr Ratio = Reference Frequency/ Sample Frequency = 0.6875 |
|---|---|---|---|---|---|
| 1.5 | 1 | 1 | 0 | −0.5 | |
| 1.1875 | 1 | 1 | 0 | −2 | |
| 0.875 | 0 | 0 | 0 | −4.5 | |
| 1.5625 | 1 | 1 | 0 | −8 | |
| 1.25 | 1 | 1 | 0 | −12.5 | |
| 0.9375 | 0 | 0 | 0 | −18 | |
| 1.625 | 1 | 1 | 0 | −24.5 | |
| 1.3125 | 1 | 1 | 0 | −32 | |
| 1 | 1 | 0 | −1 | −40.5 | |
| 0.6675 | 0 | 1 | 0 | −50 | |
| 1.375 | 1 | 1 | 0 | −60.5 | |
| 1.0625 | 1 | 1 | 0 | −72 | |
| 0.75 | 0 | 0 | 0 | −84.5 | |
| 1.4375 | 1 | 1 | 0 | −98 | |
| 1.125 | 1 | 1 | 0 | −112.5 | |
| 0.8125 | 0 | 0 | 0 | −128 | |
| 1.5 | 1 | 1 | 0 | −144.5 | |
| 1.1875 | 1 | 1 | 0 | −162 | |
| 0.875 | 0 | 0 | 0 | −180.5 | |
| 1.5625 | 1 | 1 | 0 | −200 | |
| 1.25 | 1 | 1 | 0 | −220.5 | |
| 0.9375 | 0 | 0 | 0 | −242 | |
| 1.625 | 1 | 1 | 0 | −264.5 | |
| 1.3125 | 1 | 1 | 0 | −288 | |
| 1 | 1 | 0 | −1 | −312.5 | |
| 0.6875 | 0 | 1 | 0 | −338 | |
| 1.375 | 1 | 1 | 0 | −364.5 | |
| 1.0625 | 1 | 1 | 0 | −392 | |
| 0.75 | 0 | 0 | 0 | −420.5 | |
| 1.4375 | 1 | 1 | 0 | −450 | |
| 1.125 | 1 | 1 | 0 | −480.5 | |
| 0.8125 | 0 | 0 | 0 | −512 | |
| 1.5 | 1 | 1 | 0 | −644.5 | |
| 1.1875 | 1 | 1 | 0 | −578 | |
| 0.875 | 0 | 0 | 0 | −612.5 | |
| 1.5625 | 1 | 1 | 0 | −648 | |
| 1.25 | 1 | 1 | 0 | −684.5 | |
| 0.9375 | 0 | 0 | 0 | −722 | |
| 1.625 | 1 | 1 | 0 | −760.6 | |
| 1.3125 | 1 | 1 | 0 | −800 | |
| 1 | 1 | 0 | −1 | −840.5 | |
| 0.6875 | 0 | 1 | 0 | 882 | |

| | | | | | Correct Phase | $PC_n = k*(D_n - frac(RG_n)) + 0.5 + \sum_i(W_i * X_{i+n-64}))$ $PC$ |
|---|---|---|---|---|---|---|
| 1.375 | 1 | 1 | 0 | -924.5 | | |
| 1.0625 | 1 | 1 | -1 | -968 | | |
| 0.75 | 0 | 0 | 0 | -1012.5 | | |
| 1.4375 | 1 | 1 | 0 | -1068 | | |
| 1.125 | 1 | 1 | 0 | -1104.5 | | |
| 0.8125 | 0 | 0 | 0 | -1152 | | |
| 1.5 | 1 | 1 | 0 | -1200.5 | | |
| 1.1875 | 1 | 1 | 0 | -1250 | | |
| 0.875 | 0 | 0 | 0 | -1300.5 | | |
| 1.5625 | 1 | 1 | 0 | -1352 | | |
| 1.25 | 1 | 1 | 0 | -1404.5 | | |
| 0.9375 | 0 | 0 | 0 | -1458 | | |
| 1.625 | 1 | 1 | 0 | -1512.5 | | |
| 1.3125 | 1 | 1 | 0 | -1568 | | |
| 1 | 0 | 0 | -1 | -1624.5 | | |
| 0.6875 | 1 | 1 | 0 | -1682 | | |
| 1.375 | 1 | 1 | 0 | -1740.5 | | |
| 1.0625 | 0 | 0 | -1 | -1800 | | |
| 0.75 | 1 | 1 | 0 | -1860.5 | | |
| 1.4375 | 1 | 1 | 0 | -1922 | | |
| 1.125 | 1 | 1 | 0 | -1984.5 | | |
| 0.8125 | 0 | 0 | 0 | -2048 | | |
| 1.5 | 1 | 1 | 0 | 2048 | -53.374738 | -55.507692 |
| 1.1875 | 0 | 0 | 0 | 1984.5 | -54.054787 | -56.246154 |
| 0.875 | 0 | 0 | 0 | 1922 | -54.730895 | -56.984615 |
| 1.5625 | 1 | 1 | 0 | 1860.5 | -55.399059 | -57.723077 |
| 1.25 | 1 | 1 | 0 | 1800 | -56.059155 | -58.461538 |
| 0.9375 | 0 | 0 | 0 | 1740.5 | -56.711060 | -59.200000 |
| 1.625 | 1 | 1 | 0 | 1682 | -57.354650 | -59.938462 |
| 1.3125 | 1 | 1 | 0 | 1624.5 | -57.939800 | -60.676923 |

*FIG. 16A-2*

Ave Error= 1.501476

DIGITAL PHASE DISCRIMINATIONS BASED ON FREQUENCY SAMPLING

BACKGROUND OF THE INVENTION

1. Field of the Invention

The present invention relates to digital phase discrimination.

2. State of the Art

Phase discrimination is important in digital radio communications, in particular in any angle modulation digital radio receiver. Phase discrimination and frequency discrimination are closely related. Frequency discrimination is typically performed using analog circuitry, e.g. an IQ frequency discriminator. Analog frequency discriminators have substantial drawbacks. In the case of an IQ frequency discriminator, the discriminator requires a number of analog components, two A/D conversions and a numerical arctangent operation, rendering the circuit quite complex.

Known methods exist for producing a value representing the instantaneous phase of a signal using only digital logic elements. Various such methods are described in U.S. Pat. No. 5,084,669, incorporated herein by reference. In particular, the foregoing patent describes a digital circuit for determining the instantaneous phase of a signal, from which the instantaneous frequency may be obtained if desired. Although the implementation of the circuit is all digital, it is quite involved. An improved method and apparatus for determining in a simple, all-digital manner the instantaneous phase of a signal would therefore likely be well-received by those skilled in the art.

SUMMARY OF THE INVENTION

The present invention, generally speaking, provides a simple, all-digital method and apparatus for determining the phase of a first clock signal relative to a second clock signal. The first clock signal may be a digital approximation of a periodic analog signal such as an RF signal. A sampling technique is employed that produces a stream of digital bits containing relative phase information. From the stream of digital bits is formed a digital word indicative of the relative phase. The digital word may be formed using a digital filter. Advantageously, an extensive body of digital filtering techniques applicable to Sigma-Delta (sometimes referred to as Delta-Sigma) A/D converters may be applied directly to the digital stream. By using an appropriately-chosen weighting function, high accuracy may be obtained.

BRIEF DESCRIPTION OF THE DRAWING

The present invention may be further understood from the following description in conjunction with the appended drawing. In the drawing:

FIG. 1 is a block diagram illustrating a sampled-data model of a Sigma-Delta modulator and of a sampling circuit applied to frequency sampling in accordance with one embodiment of the present invention;

FIG. 2 is a table helpful in explaining operation of the circuit model of FIG. 1 in the instance of an input frequency that is 0.6875 times a reference frequency;

FIG. 3 is a timing diagram illustrating the principle of operation of the circuit model of FIG. 1 as applied to frequency sampling;

FIG. 11A is a tabulation illustrating one method of digital phase discrimination;

FIG. 12A is a tabulation illustrating another method of digital phase discrimination

FIG. 14A is a tabulation illustrating yet another method of digital phase discrimination;

FIG. 16A is a tabulation illustrating still another method of digital phase discrimination;

DETAILED DESCRIPTION OF THE PREFERRED EMBODIMENTS

The approach followed by the digital frequency discriminator of the present invention may be appreciated by analogy to Sigma-Delta A/D conversion, well-documented in the prior art by such references as "Oversampling Delta-Sigma Data Converters", Candy, et al., *IEEE Press*, pages 1–6, Piscataway, N.J. (1992). A Sigma-Delta converter modulates a varying-amplitude analog input signal into a simple digital code at a frequency much higher than the Nyquist rate. The design of the modulator allows resolution in time to be traded for resolution in amplitude. A sampled-data circuit model of a Sigma-Delta modulator, shown in FIG. 1, may be directly applied to frequency sampling as described herein.

Referring to FIG. 1, an input signal $x_i$ occurring at sample time i has subtracted from it the output signal $y_i$ at sample time i. The result is applied to an accumulator having an output signal $w_i$. A "new" input signal of the accumulator at sample time i is combined with the "old" output signal of the accumulator to form a new output signal of the accumulator. The output signal of the accumulator is quantized, the quantization being represented as the addition of an error $e_i$. The output signal of the quantizer is the final output signal $y_i$.

Assume now that $x_i$ is the ratio of two frequencies and that the quantizer is a two-level quantizer. Further assume that the ratio of the two frequencies for the time period in question is, say, 0.6875. As shown in FIG. 2, the latter value is accumulated a first time, giving an accumulated value of 0.6875. This valuing being less than 1, the value 0.6875 is again added to the accumulated value, giving a new accumulated value of 1.375. Since this value is now greater than 1, 1 is subtracted from 0.6875 and the result (0.6875−1=−0.3125) added to the accumulator to give a value of 1.0625. Operation proceeds in this fashion. During the foregoing sequence of operations, a data stream is produced by taking the integer portion, 1 or 0, of each accumulated value.

Referring to FIG. 3, the interpretation of the sequence of numbers shown in FIG. 2 may be appreciated. Two clock signals are shown. Again, it is assumed that the ratio of the frequency of the upper clock signal to that of the lower clock signal during the period of interest is 0.6875. At time t=0, rising edges of both clock signals coincide. At the first subsequent rising edge of the lower clock signal, 0.6875 periods of the upper clock signal have elapsed. At the next rising edge of the lower clock signal, 1.375 periods of the upper clock signal have elapsed. At the next rising edge of the lower clock signal, 1.0625 periods of the upper clock signal have elapsed since the elapse of the first period of the upper clock signal, and so on.

Figure 4:
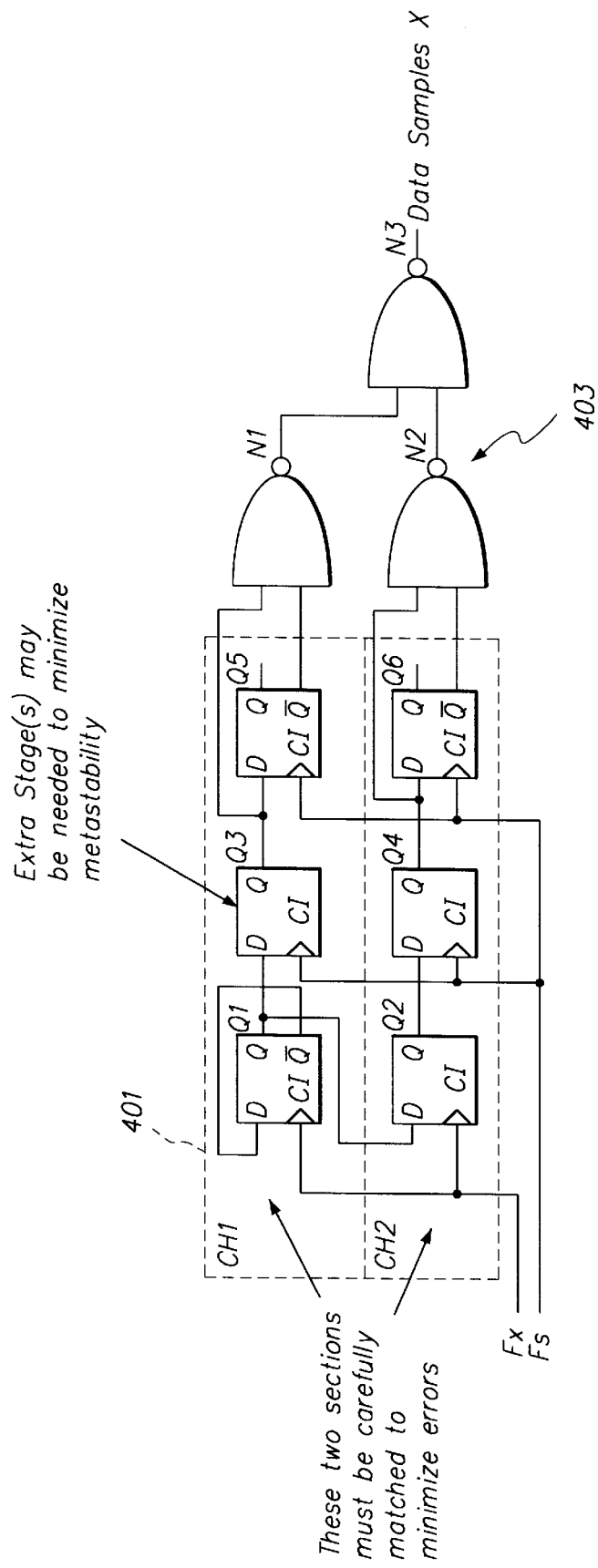
FIG. 4 is a schematic diagram of one example of a frequency sampling circuit described by the circuit model of FIG. 1.

A schematic diagram of a capture circuit, or frequency sampling circuit, that may be used to data samples corresponding to the data stream described in the foregoing example is shown in FIG. 4. In the illustrated embodiment, it is assumed that the ratio of the clock signals is such that no more than one rising edge of the faster clock will occur during a single period of the slower clock. In other embodiments, this assumption need not apply.

The capture circuit includes a input portion 401 and an output portion 403. The input portion includes two sections Ch1 and Ch2 that must be carefully matched to minimize errors. Each section comprises a chain of two or more D flip-flops coupled in series. In the following description, the same reference numerals will be used to reference the respective flip-flops themselves and their respective output signals.

Within each section, the first flip-flop in the chain is clocked by a sampled clock signal Fx. The succeeding flip-flops in the chain are clocked by a sampling clock signal Fs. The D input of the first flip-flop Q1 in the upper section is coupled to the $\overline{Q}$ output of the same. The D input of the first flip-flop in the lower section is coupled to the Q output of the first flip-flop in the upper section. The remaining flip-flops in both sections are coupled in series—i.e., Q to D, Q to D.

The function of the input portion is to 1) produce two signals, logical inverses of one another, that transition on rising edges of the clock signal Fx; 2) to latch the values of the two signals on the rising edge of the clock signal Fs; and 3) to detect transitions from one clock to the next. Additional intermediate stages in series with Q3 and Q4 may be required to minimize metastability resulting from the asynchrony of the two clock signals, and in fact multiple such stages may be desirable in a particular design.

The output portions include, in an exemplary embodiment, three two-input NAND gates. Respective NAND gates N1 and N2 are coupled to the D and $\overline{Q}$ signal of the final flip-flop stages of the input sections. Output signals of the NAND gates N1 and N2 are combined in the further NAND gate N3 to form the final output of the capture circuit.

The function of the output portion is to detect a change in the input clock signal level from one sample clock to the next in either of two channels formed by the two input sections. The two input sections function in a ping-pong fashion, alternately detecting changes in the input clock signal level.

Figure 5:
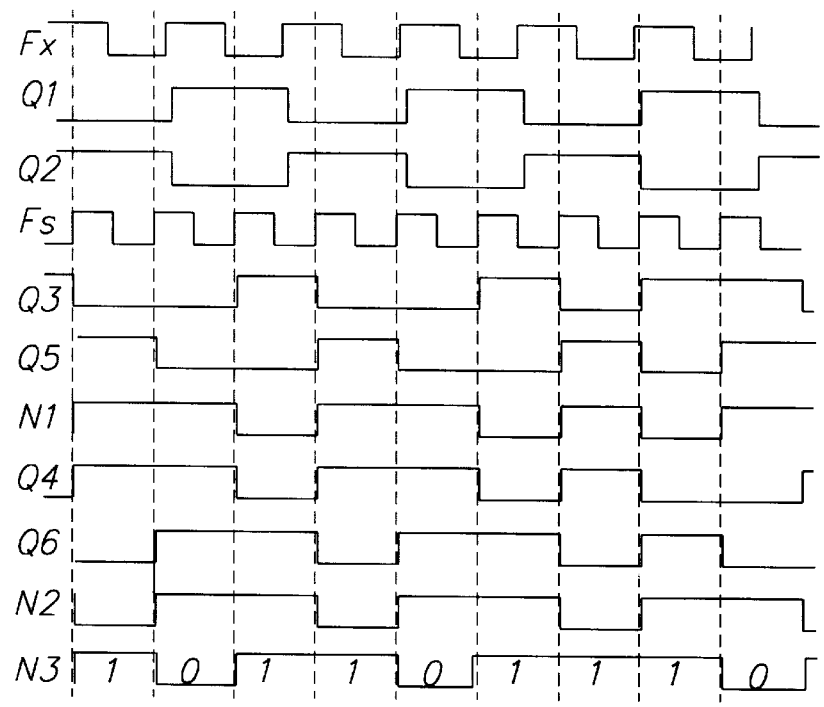
FIG. 5 is a first timing diagram illustrating operation of the frequency sampling circuit of FIG. 4.

Operation of the capture circuit of FIG. 4 may be more fully appreciated with reference to the timing diagram of FIG. 5. The first stages of the two channels form inverse signals Q1 and Q2 approximately coincident with (but slightly delayed from) rising edges of the input clock signal. The signals Q3 and Q4 are formed by sampling the signals Q1 and Q2, respectively, in accordance with the sample clock. The signals Q5 and Q6, respectively, are delayed replicas of the signals Q3 and Q4. The NAND gates together realize the logic function X=Q3·$\overline{Q5}$ v Q4·$\overline{Q6}$.

Figure 6:
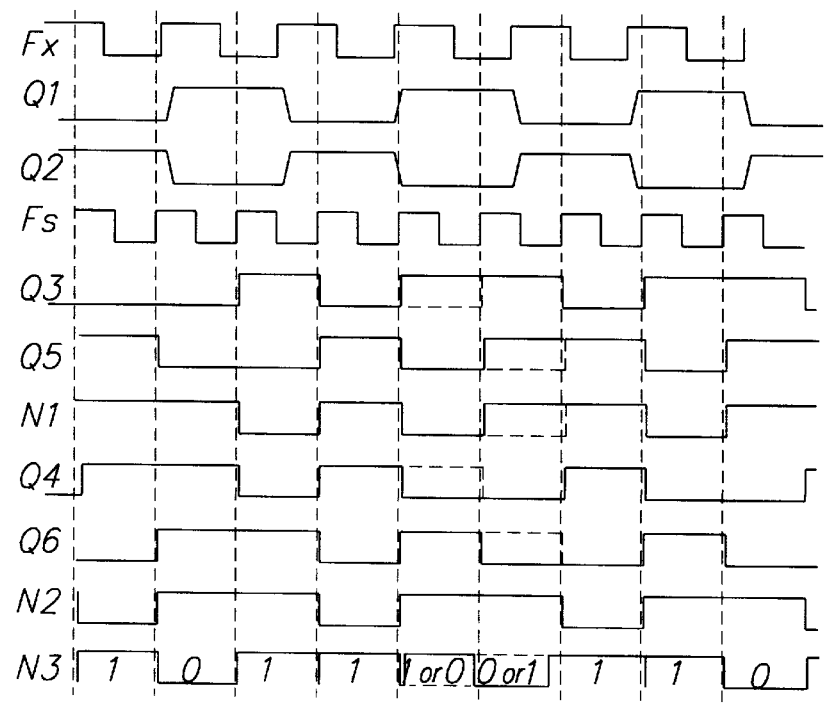
FIG. 6 is a second timing diagram illustrating operation of the frequency sampling circuit of FIG. 4.

In the example of FIG. 5, the illustrated signals are all idealized square-wave signals. In actuality, the signals will have finite rise and fall times. The possible effect of the finite rise and fall times of the signals Q1 and Q2 and the asynclrony of the circuit is metastability, as illustrated in FIG. 6. Here, the signals Q3 and Q5 and the signals Q4 and Q6 are each in an indeterminate state for one cycle. The resulting output of the circuit may or may not be correct. However, because the decision was a "close call" to begin with, the effect of an occasional erroneous decision on the overall operation of the circuit is negligible. The time window of instability is reduced by increasing the overall gain in the path. If the gain in Q3 and Q9 is sufficient to reduce the probability of an error to an acceptable level, then no additional circuitry is required. If not, then additional circuitry will be required to increase the gain.

In order to recover the ratio of the frequencies of the two clock signals from the data stream produced by a capture circuit such as the one of FIG. 4, digital filtering is applied. Advantageously, an extensive body of digital filtering techniques applicable to Sigma-Delta (or Delta-Sigma) A/D converters may be applied directly to the digital stream. Furthermore, by using an appropriately-chosen weighting function, high accuracy may be obtained.

The weighted sum of products is an example of an FIR filter. The weighting function described heretofore is therefore that of an FIR filter in digital filtering theory. It should be recognized, however, that IIR filters can also be used. In the process of FIR digital filtering, the weighting function is applied to a "window" of data samples to obtain an estimate of the ratio of frequencies in the center of the window. The window is then "picked up and moved" to the next sequence of samples. Windowing will typically overlap. A window may include 256 samples, for example.

Figure 7:
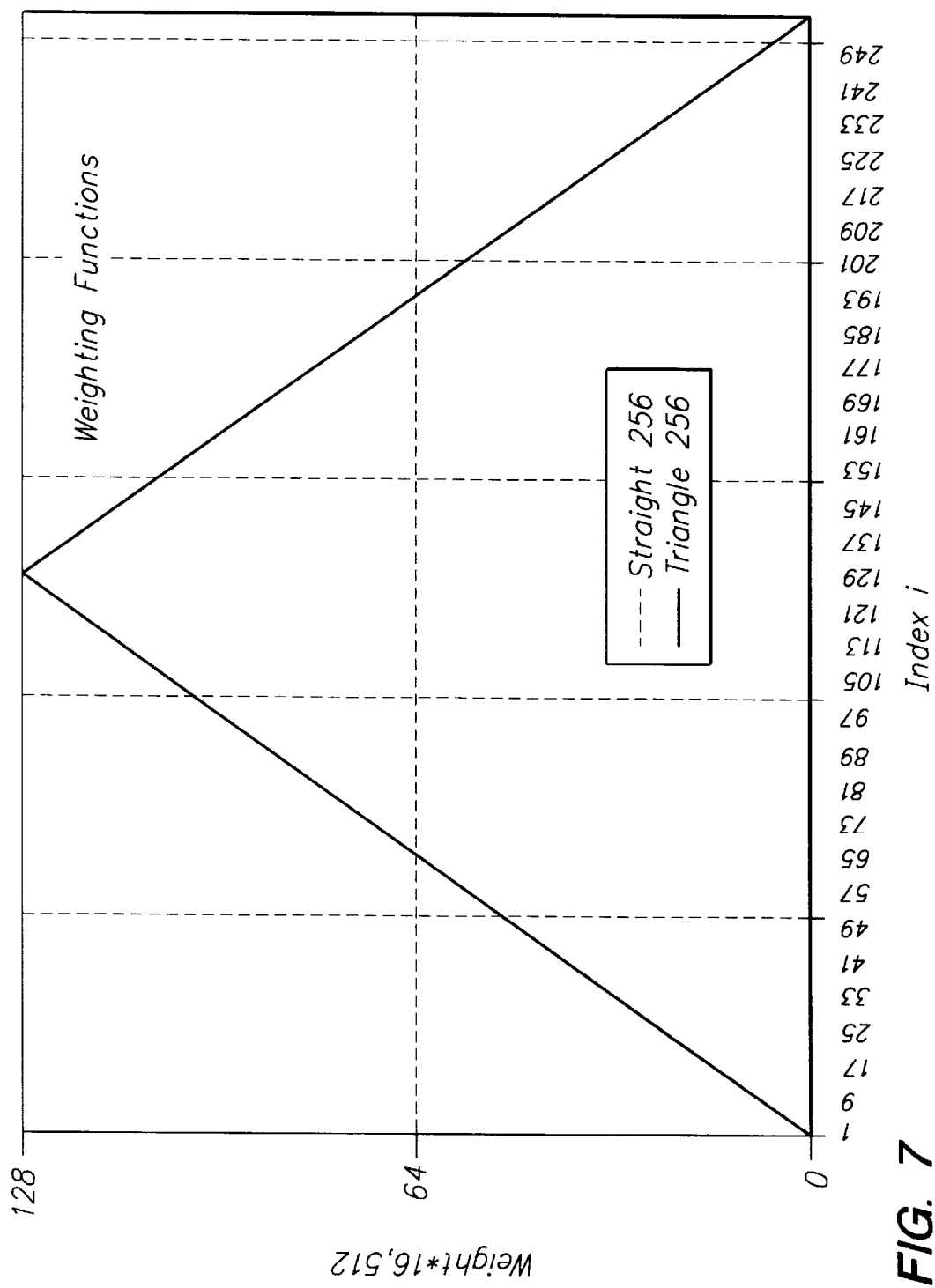
FIG. 7 is a graph of two alternative weighting functions that may be used to perform digital filtering of a digital bit stream produced by a circuit such as that of FIG. 4.

Referring to FIG. 7, two alternative weighting functions are shown for a window of 256 samples. The weighting functions are normalized, meaning that the area under the weighting function is unity. One weighting function, indicated in dashed lines, is a straight-line, constant weighting function. Another weighting function, indicated in solid line, is a triangular weighting function. The weighting function is the impulse response function in digital filters.

Figure 8:
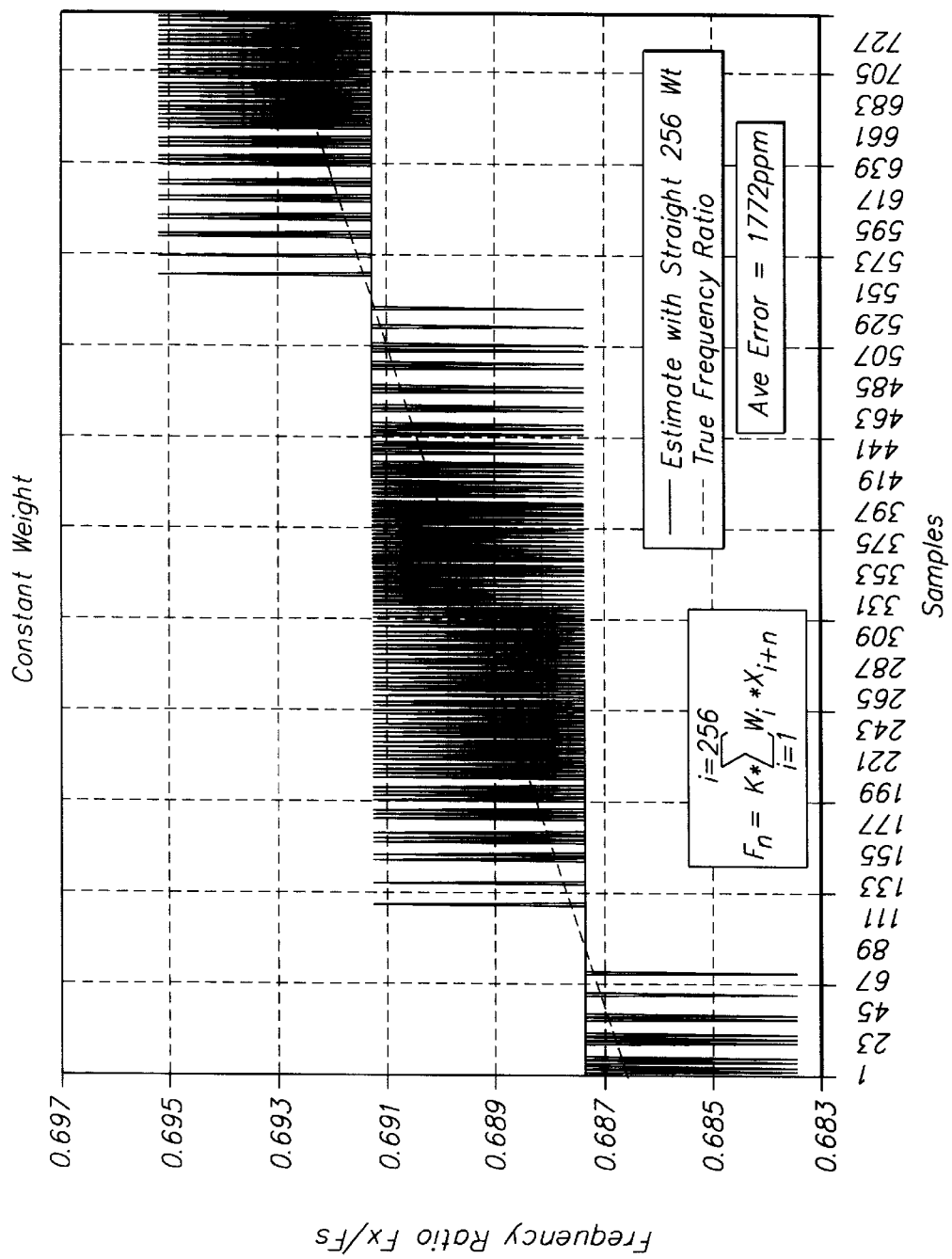
FIG. 8 is a graph illustrating the accuracy obtained from a digital frequency discriminator using a constant weighting function.
Figure 9:
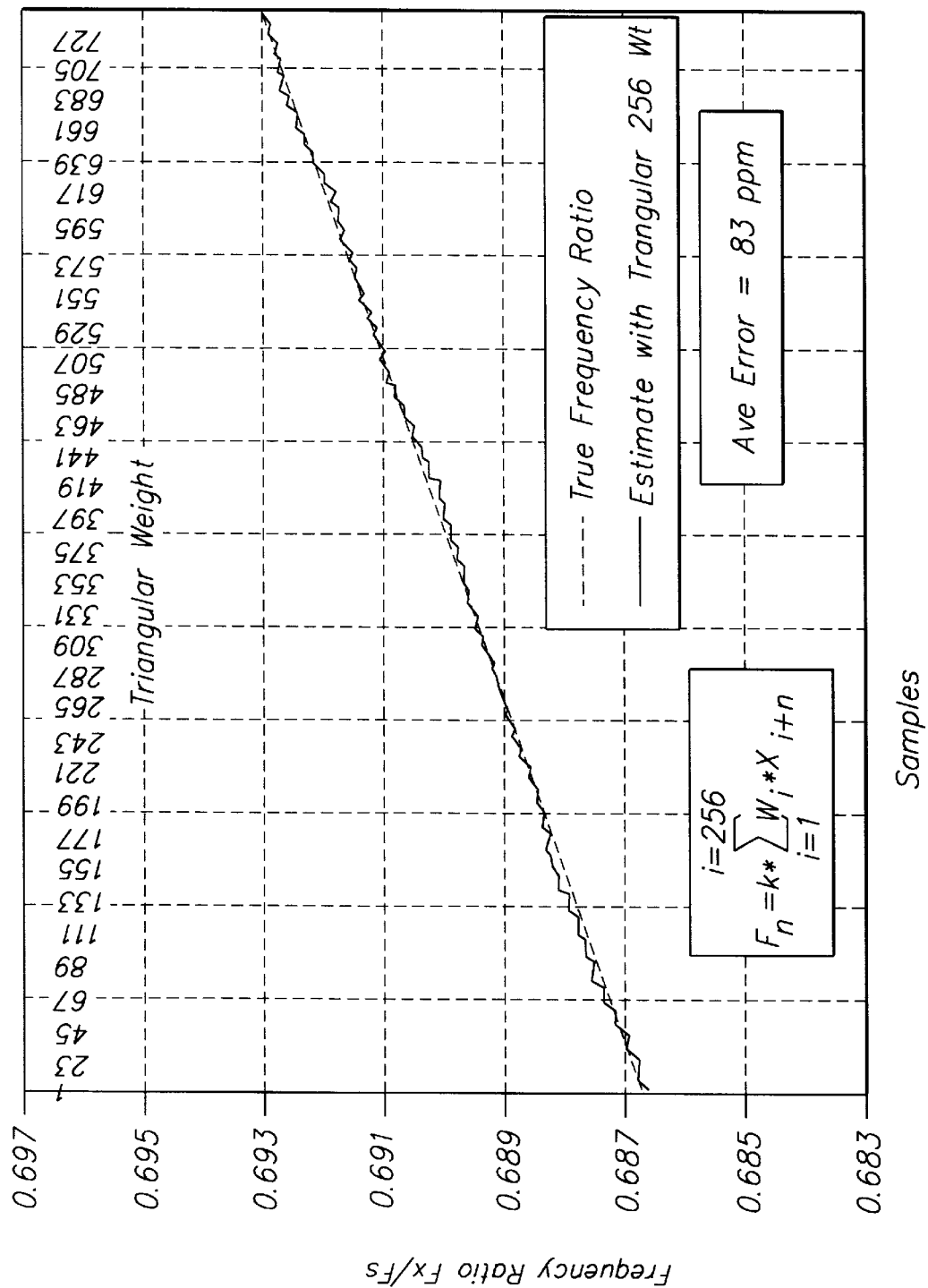
FIG. 9 is a graph illustrating the accuracy obtained from a digital frequency discriminator using a triangular weighting function.

Results of digital filtering using the straight-line weighting function and the triangular weighting function respectively, are shown in FIG. 8 and FIG. 9. In the case of both FIG. 8 and FIG. 9, the frequency ratio was increased from just under 0.687 to just over 0.693. As seen in FIG. 8, using a straight-line weighting function, the quantized signal oscillates between two levels that are adjacent to the input in such a manner that its local average equals the average input. The average error was calculated to be 1772 ppm. As seen in FIG. 9, using a triangular weighting function, the quantized signal tracks the input with an average error of 83 ppm.

Figure 10:
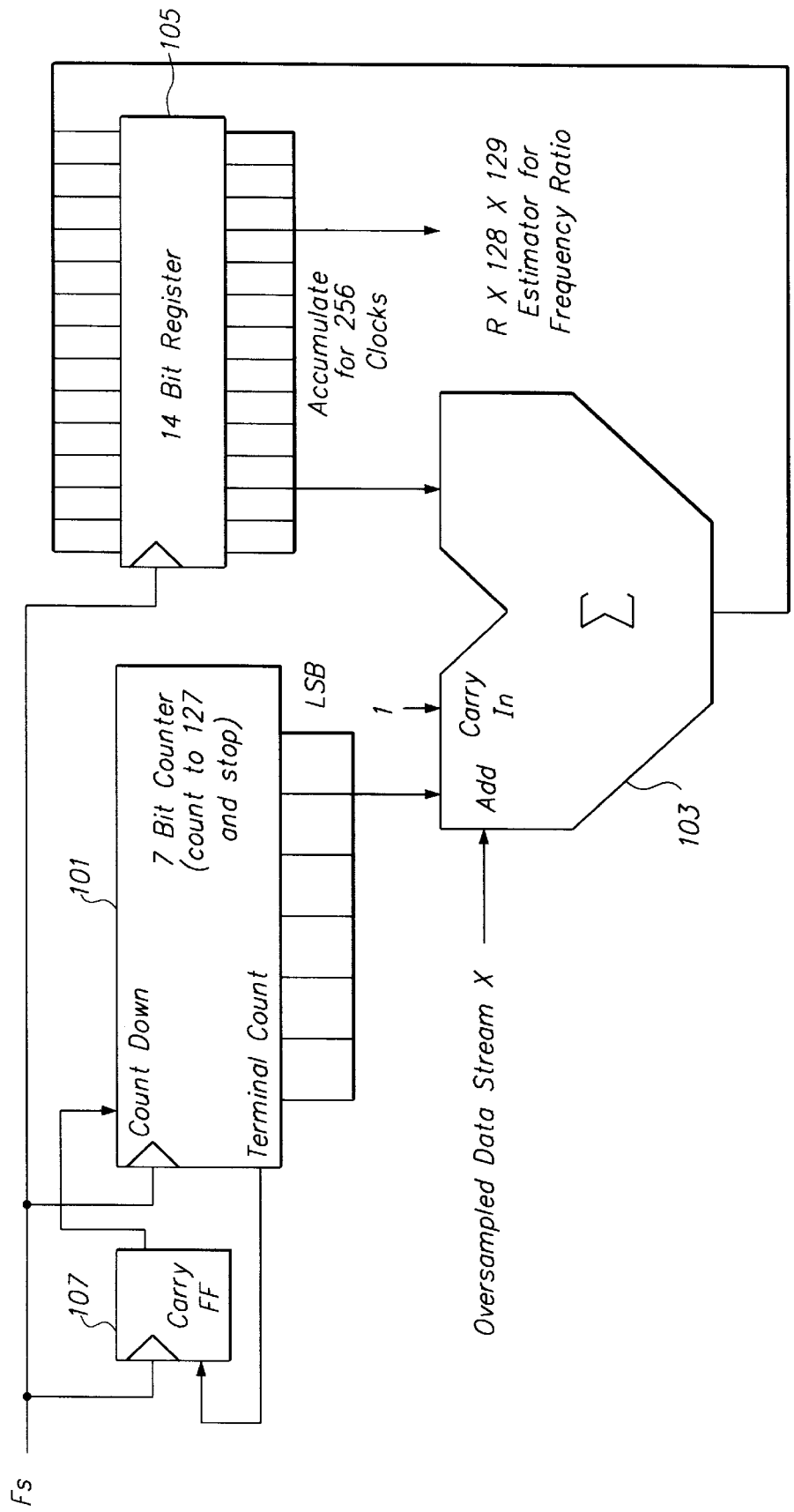
FIG. 10 is a block diagram of one example of a digital filter that may be used in conjunction with a frequency sampling circuit such as that of FIG. 4.

A schematic diagram of an exemplary frequency accumulator that applies a triangular weighting function and that may be used to accomplish the desired digital filtering is shown in FIG. 10. In the example shown, the frequency accumulator uses a 7-bit counter 101, a 14-bit adder 103 and a 14-bit register 105. The 7-bit counter is clocked by the sample frequency Fs. The output of the 7-bit counter is provided to one input of the adder. The function of the 7-bit counter is to count up from 0 to 127 and then down from 127 to 0. The count of 127 occurs twice in succession. This behavior is achieved using a flip-flop 107. The flip-flop is clocked by the sample frequency Fs. A Terminal Count signal of the 7-bit adder is input to the flip-flop. The output of the flip-flop is coupled to a Count Down input of the 7-bit counter.

The "oversampled" data stream is coupled to a control input of the adder. When the current bit of the data stream is a 1, an addition is performed. When the current bit is a 0, no addition is performed. A Carry In input of the adder is tied high, effectively causing the range of weights to be 1 to 128.

The 14-bit register is clocked by the sample frequency Fs. Its output is applied to the other input of the adder. Its input receives the output word produced by the adder. The function of the 14-bit adder is to perform an accumulation operation for 256 clocks. At the conclusion of the 256 clocks, the output of the 14-bit adder is used as an estimator for the frequency ratio. More particularly, in the example shown, the output of the accumulator is equal to R×128× 129, where R is the frequency ratio estimator.

The foregoing technique may be readily extended to phase discrimination. Various different methods and apparatus for digital phase discrimination will be described entailing different design tradeoffs.

Figure 11B:
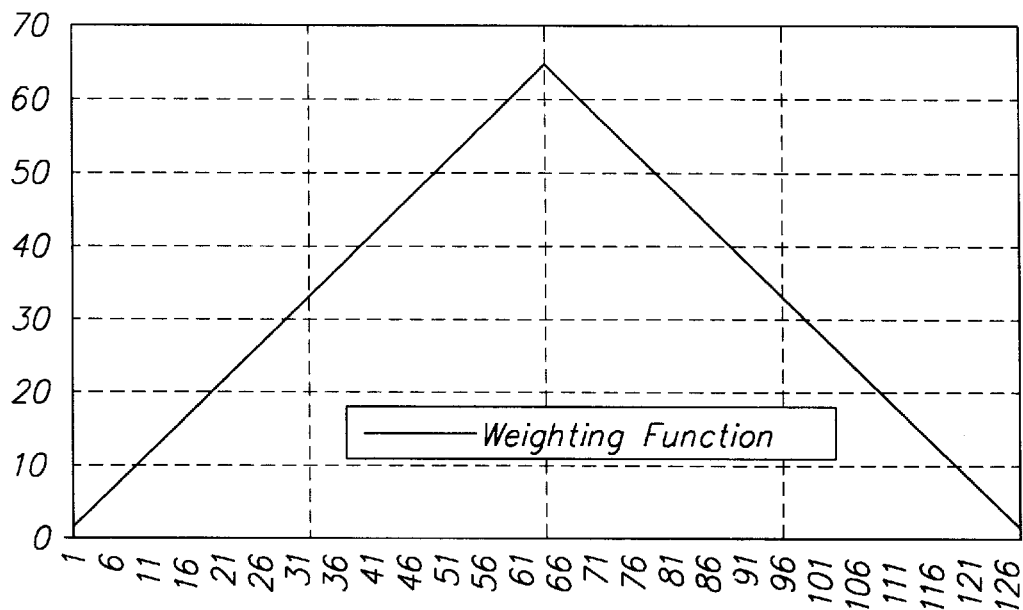
FIG. 11B is a plot showing results of the method of FIG. 11A.

The first method is conceptually straightforward but computationally expensive. Referring to FIG. 11A, the same observed frequency data stream and the same set of weights corresponding to a triangular weighting function (FIG. 11B) are used. The ratio of the reference frequency to the sampled frequency over a relatively long period of time is first determined using the technique described previously. Having obtained this frequency ratio estimator, short-term frequency deviations are estimated by calculating the same frequency estimate as before but at a relatively high rate, as often as once per sample period. That is, successive samples are all taken using the circuit of FIG. 10, as often as each sample period. The difference ($\Delta F$) of each frequency estimate (F) from the previously-determined frequency ratio (Fr) is calculated, multiplied by an appropriate scale factor k and accumulated to obtain a corresponding phase estimate Pf. (The first value of Pf is an arbitrarily chosen initial condition, chosen for comparison to an ideal estimate. In practice, the phase may be initialized to a value based on a priori knowledge of signal characteristics, or, absent such a priori knowledge, may be set to zero upon detection of a phase inflection point.)

Figure 11C:
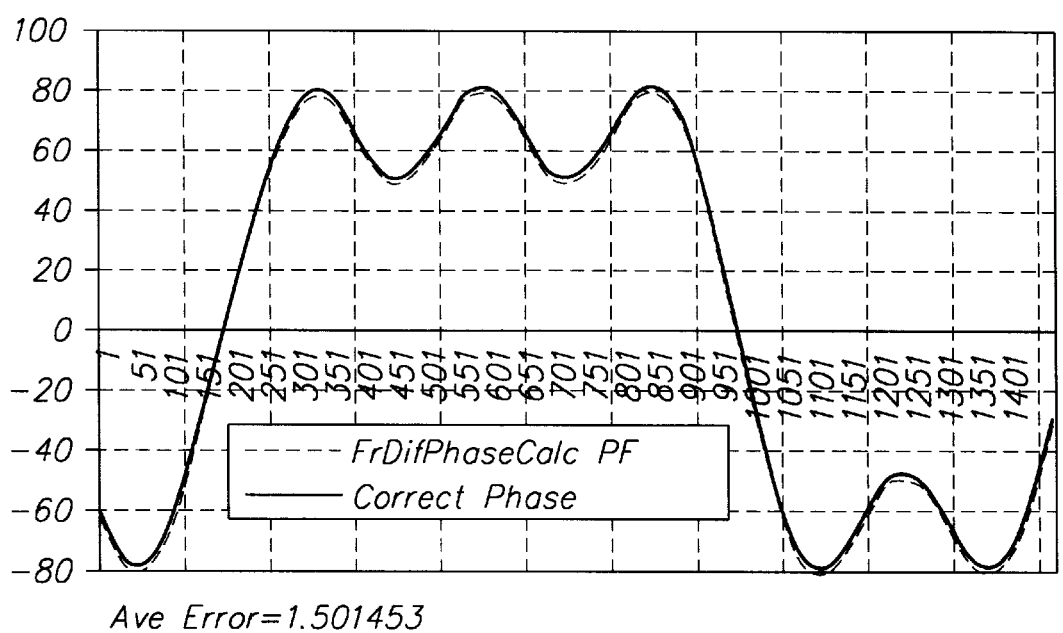
FIG. 11C is a plot of a weighting function used in connection wit FIGS. 11A and 11B.

A phase-plot simulation comparing actual phase of a specified waveform (solid-line) with estimated phase using the foregoing phase estimation method (dashed-line) is shown in FIG. 11C.

Figure 12B:
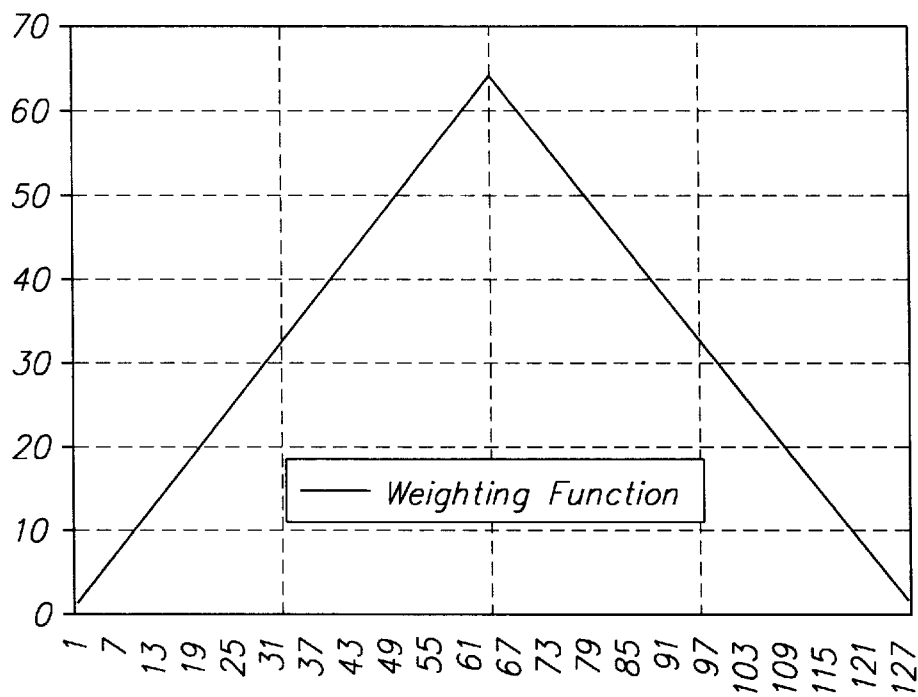
FIG. 12B is a plot showing results of the method of FIG. 12A.

The foregoing "frequency difference" phase estimation method is computationally expensive because of the need to calculate frequency estimates at a relatively high rate. A "pre-summation difference" phase estimation method obviates this requirement. Referring to FIG. 12A, instead of subtracting the frequency ratio from a frequency estimate, the frequency ratio Fr is subtracted from the sampled data stream itself. Assuming that the data stream is a bit stream of ones and zeros only, and assuming a frequency ratio Fr=0.6875, then the pre-summation difference Y will have one of only two values, Y=1−0.6875=0.3125 or Y=0−0.6875=−0.6875. The Y values are accumulated to obtain corresponding values PX. Phase estimates $PP_n$ are obtained by filtering the PX values in substantially the same manner as described previously in relation to forming frequency estimates (using the identical weighting function, FIG. 12B, for example) with the exception that the filtered values are scaled by the scale-factor k.

Figure 12C:
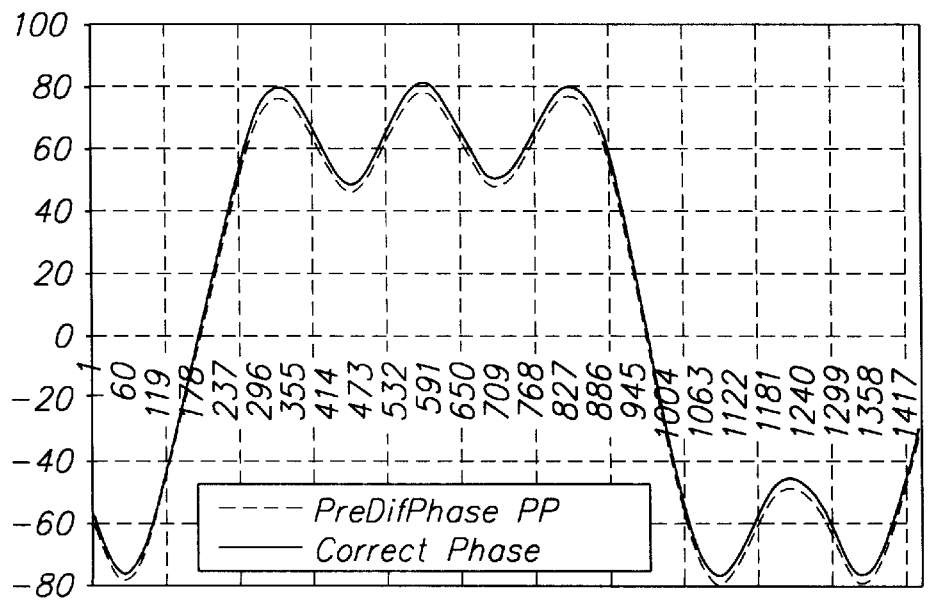
FIG. 12C is a plot of a weighting function used in connection with FIGS. 12A and 12B.

The pre-summation difference phase-calculation may be shown to be mathematically equivalent to the frequency difference phase calculation. Simulation results, shown in FIG. 12C, are therefore the same as in FIG. 11C. The hardware realization, however, may be considerably simpler using the pre-summation difference phase calculation, since only one computation is required per phase point. Such a hardware realization is shown in FIG. 13.

Figure 13:
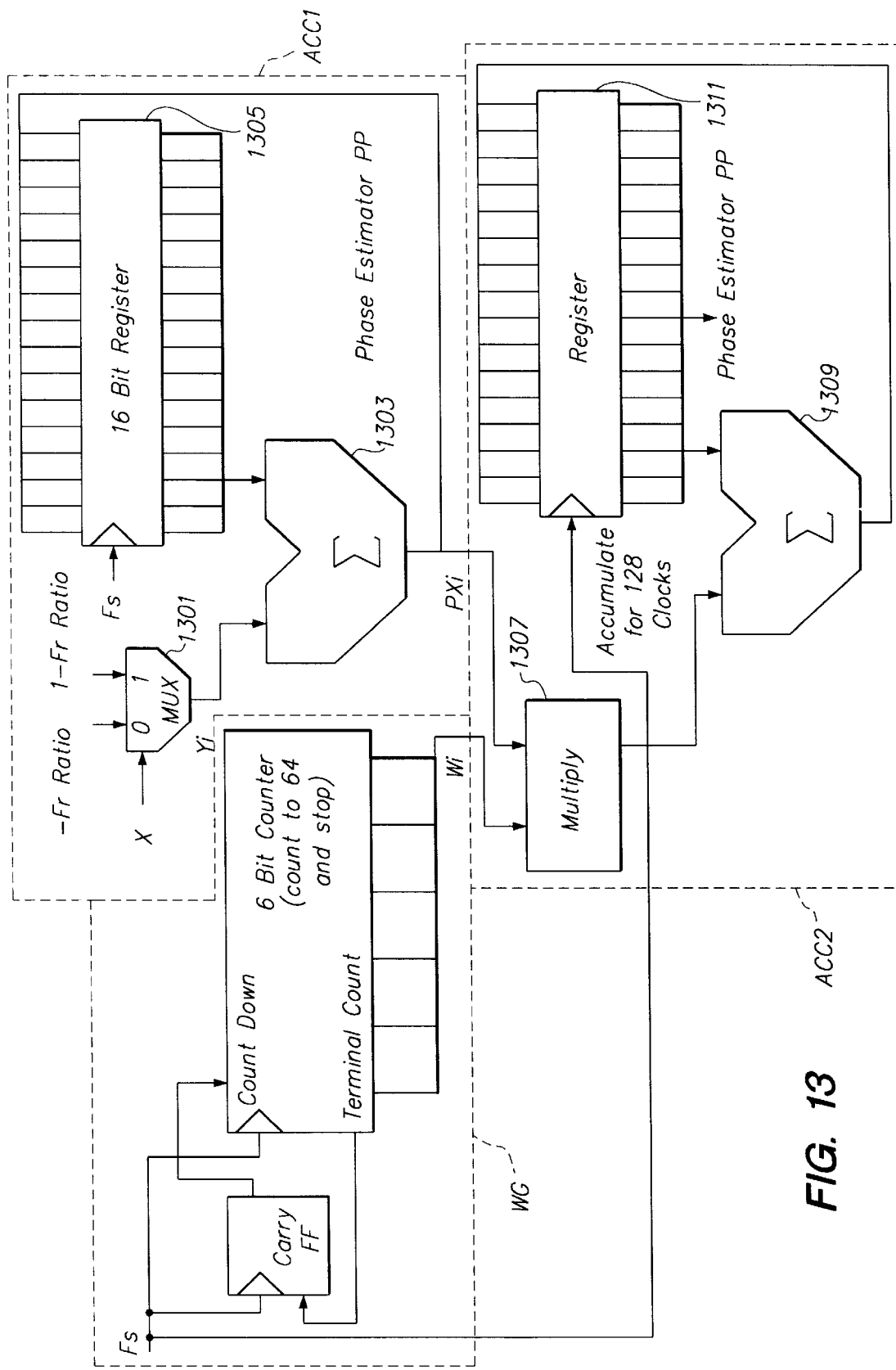
FIG. 13 is a block diagram of digital phase discrimination hardware in accordance with the technique of FIG. 12.

The pre-summation difference phase estimator of FIG. 13 includes generally a first accumulator ACC1, a weight generator WG similar or identical to the weight generator previously described in relation to FIG. 10, and a second accumulator ACC2.

The accumulator ACC1 functions to produce phase numbers $PX_i$ in correspondence to bits (or in other embodiments, symbols) of the observed frequency data stream and includes a multiplexer 1301, an adder 1303 and a register (e.g., a 16-bit register) 1305. The multiplexer 1301 selects one of the two possible values of $Y_i$ in accordance with the value of X and applies $Y_i$ to the adder 1303. The register value is added to $Y_i$ to form $PX_i$, which is then strobed into the register. The adder 1303 and register 1305 therefore accumulate the $PX_i$ values.

The $PX_i$ values are then filtered in the accumulator ACC2, which includes a multiplier 1307, an adder 1309 and a register 1311. The multiplier receives weights from the weight generator WG and $PX_i$ values from the accumulator ACC1. Respective weights and $PX_i$ values are multiplied and the products accumulated, e.g., for 128 clock cycles, to produce a phase estimator PP. The multiplier may be constructed so as to apply the scale factor k to each product during the accumulation process. Note that the resolution of the digitial word indicative of the phase (Phase Estimator PP output from register 1311), in this instance 16 bits, is much greater than that of the low-resolution samples X, which in this instance is 1 bit.

Figure 14B:
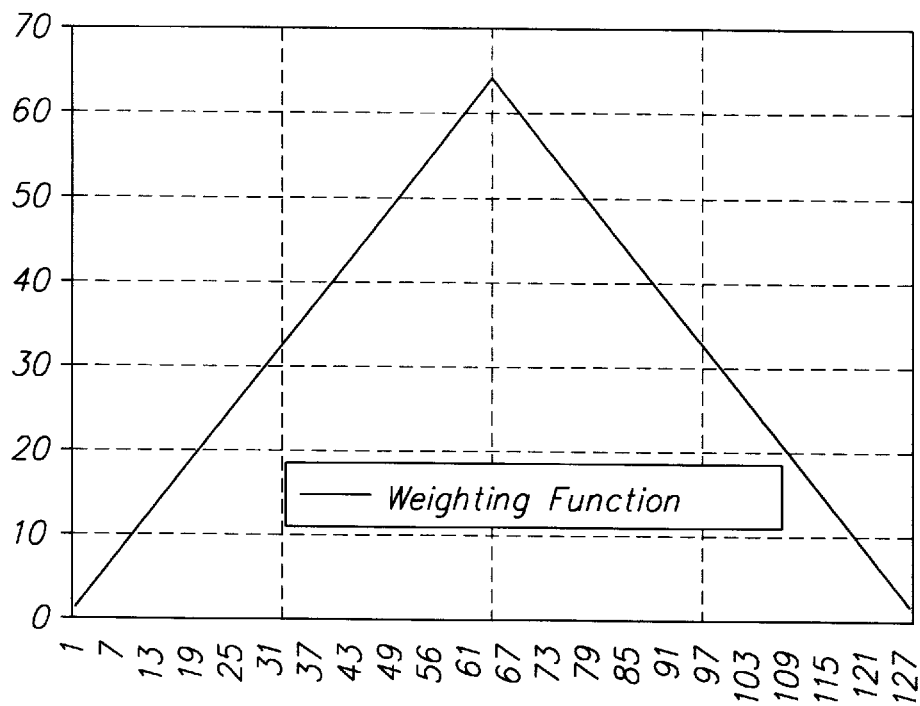
FIG. 14B is a plot showing results of the method of FIG. 14A.
Figure 14C:
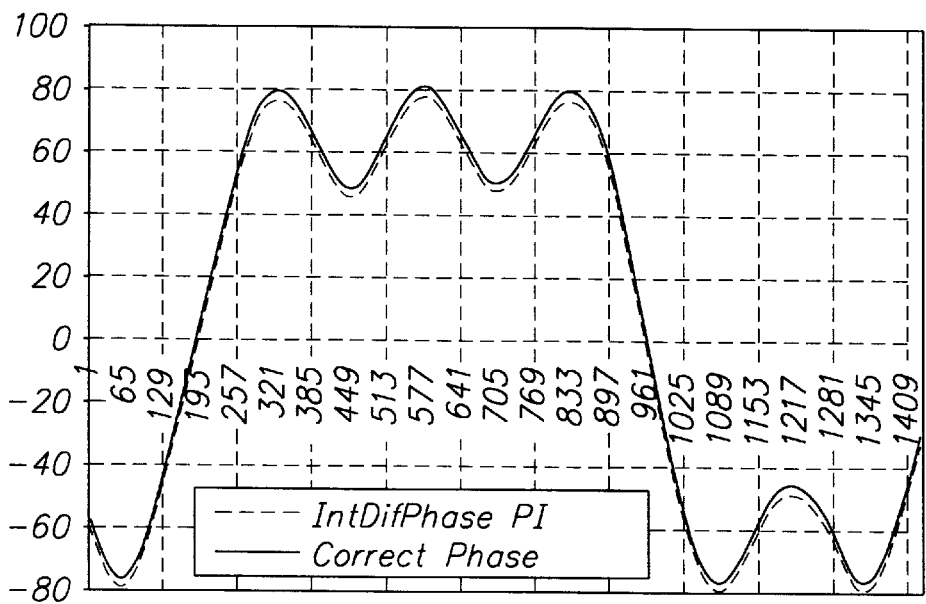
FIG. 14C is a plot a weighting function used in connection with FIGS. 14A and 14B.

An even simpler realization may be achieved using an integer difference phase calculation. The integer difference phase calculation is not mathematically equivalent to the foregoing methods, but is very close. Referring to FIG. 14A, this method uses, in addition to the observed frequency data stream, a reference frequency data stream that would result if the reference frequency were applied to the capture circuit of FIG. 4 (with the same clock). A running sum $D_i$ is then formed of the integer difference $X_i-R_i$. In many practical applications, such as the one illustrated in FIGS. 14 and 15, $D_i$ will have the values 1, 0 and −1 exclusively. The general case in which $D_i$ takes on other values may be appreciated and understood, however, from the present example, and is embraced by the present description.

Phase estimates are formed by filtering the $D_i$ values in the same or similar manner as previously described. The same triangular weighting function may be used FIG. 14B. The integer difference phase calculation method produces identical simulation results, FIG. 14C, as the preceding methods.

Figure 15:
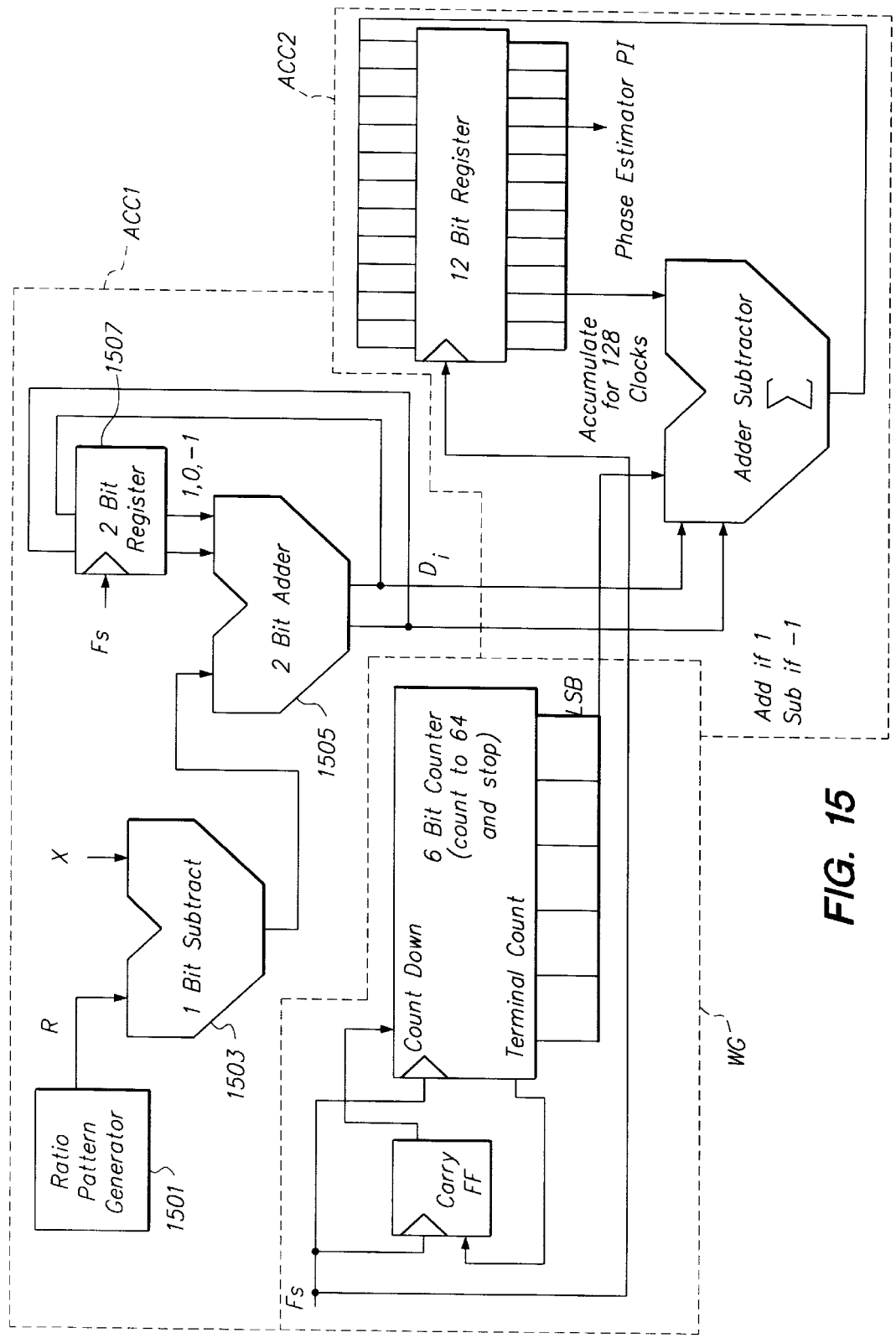
FIG. 15 is a block diagram of digital phase discrimination hardware in accordance with the technique of FIG. 14.

Referring to FIG. 15, in the instance where D takes on the values 1, 0 and −1 exclusively, the corresponding hardware realization may be substantially simplified (as compared to that of FIG. 13, for example).

The integer difference phase estimator of FIG. 15, like that of FIG. 13, includes generally a first accumulator ACC1, a weight generator WG, and a second accumulator ACC2. The accumulator ACC1 is of considerably different construction than the corresponding structure of FIG. 13. The accumulator ACC1 of FIG. 15 includes a reference pattern generator 1501, a 1-bit subtractor 1503, a 2-bit adder 1505 and a 2-bit register 1507. The 1-bit subtractor subtracts respective R values from respective X values. The 2-bit adder and the register accumulate the resulting $D_i$ values which, as explained previously, may be constrained to 1, 0, −1 only.

The weight generator WG and the accumulator ACC2 are substantially the same as in FIG. 13, described previously. However, because $D_i$ takes on the values 1, 0 and −1 exclusively, no multiplier is required. Instead, if $D_i=1$, the weight value is added to the accumulated value, and if $D_i=-1$, the weight value is subtracted. (If $D_i=0$, the accumulated value remains unchanged.) The savings of a hardware multiplier is a particular advantage of the implementation of FIG. 15.

Figure 16B:
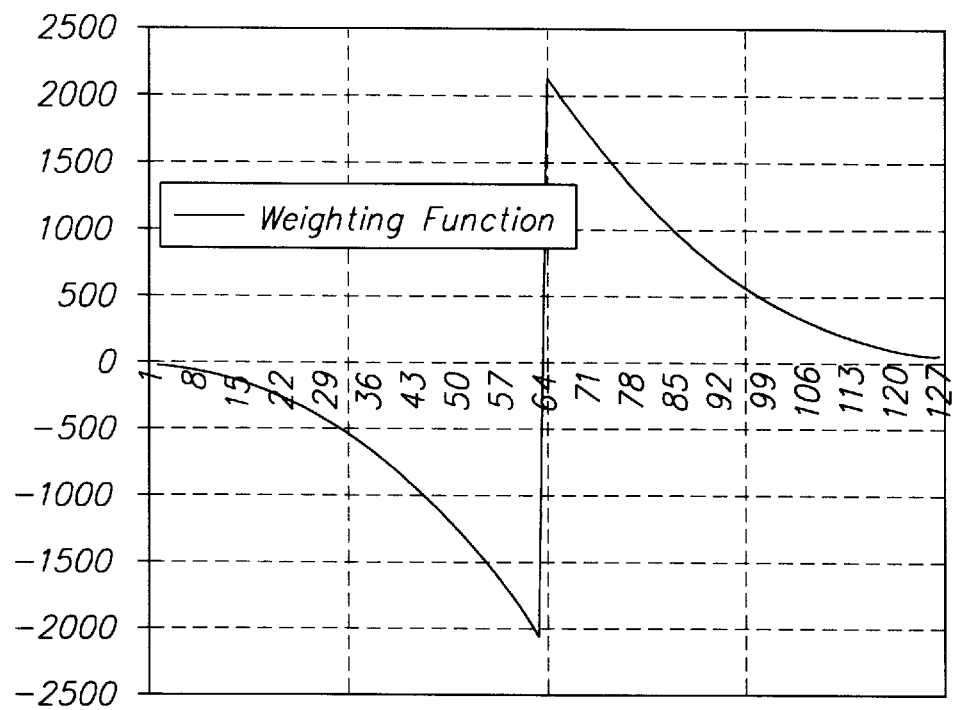
FIG. 16B is a plot showing results of the method of FIG. 16A.

A further method of phase estimation is referred to as the clock measure phase calculation method. Referring to FIG. 16A, this method is similar to the previous integer difference phase calculation method insofar as R, X and D are concerned. This method, however, uses in addition to the reference frequency data stream R, "clock measure" numbers RG, which are the same as the numbers appearing in FIG. 2. Moreover, the weight function used is distinctly different, as shown in FIG. 16B. Clock measure phase estimate values PC are obtained using the following formula:

$$PC_n = k \cdot \left( D_n - frac(RG_n) + 0.5 + \sum_i (W_i \cdot X_{i+n-64}) \right)$$

Figure 16C:
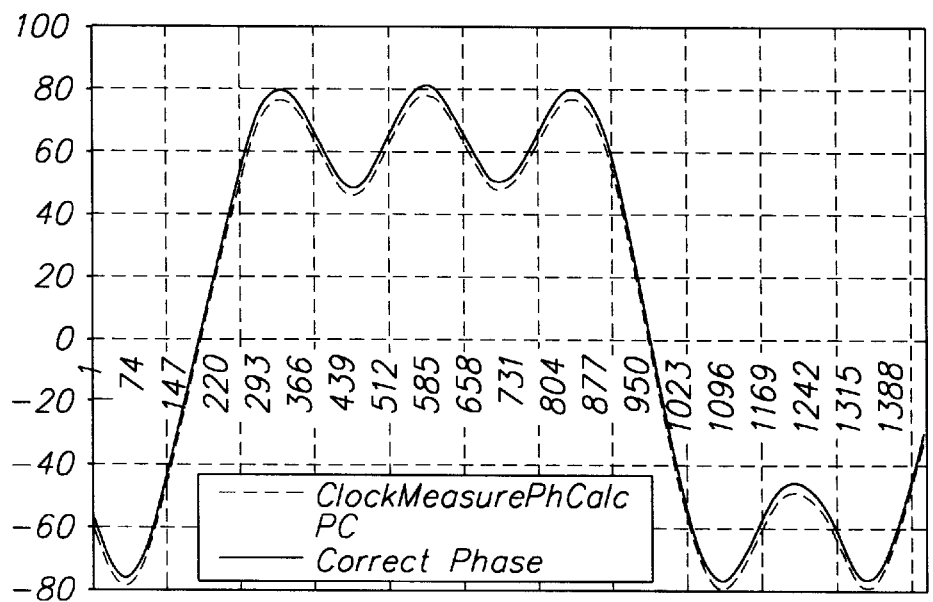
FIG. 16C is a plot of a weighting function used in connection with FIGS. 16A and 16B.

Simulation results using the clock measure phase calculation method are shown in FIG. 16C.

Figure 17:
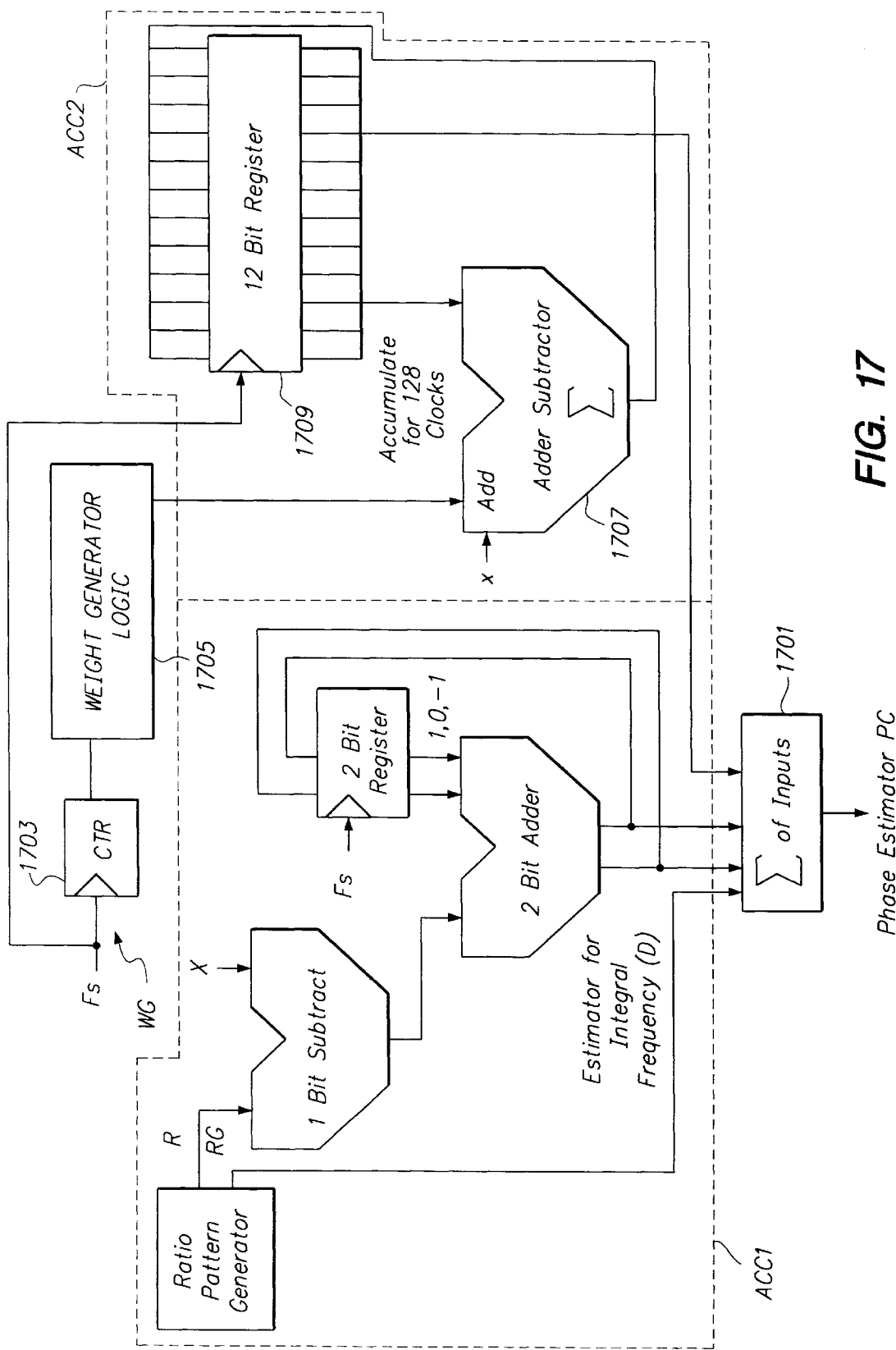
FIG. 17 is a block diagram of digital phase discrimination hardware in accordance with the technique of FIG. 16.

Referring to FIG. 17, the clock measure phase estimator includes generally a first accumulator ACC1, a weight generator WG, and a second accumulator ACC2. The estimator additionally includes a summation block 1701.

The accumulator block ACC1 is substantially the same as the accumulator block ACC1 of FIG. 15. Note, however, that the reference pattern generator generates both the reference frequency data stream R, used within the accumulator ACC1, and the clock measure data stream RG which is input to the summation block 1701.

The weight generator includes a counter 1703 and weight generator logic 1705.

The accumulator ACC2 includes an adder 1707 and a register 1709. When X=1, the weight value from the weight generator is added to the contents of the register 1709. The output of the adder becomes the new input of the register, which performs an accumulator operation for, e.g., 128 clock cycles.

At the conclusion of the accumulation operation of ACC2, the outputs of ACC1 and ACC2, together with the corresponding RG value, are summed in the summation block 1701.

It will be appreciated by those of ordinary skill in the art that the invention can be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalents thereof are intended to be embraced therein.

What is claimed:

1. A method of determining the phase of a first clock signal using a second clock signal, comprising:

sampling the first clock signal in accordance with the second clock signal to produce a stream of digital bits or symbols wherein a frequency ratio of the first clock signal and the second clock signal is variable throughout a range including non-integer values; and performing postprocessing of the stream of digital bits or symbols to form, from a substantial number of said digital bits or symbols, a digital word indicative of the phase;

wherein each digital bit or symbol of a sequence of consecutive digital bits or symbols represents a number of transitions n of a predetermined polarity of the first clock signal that occurred during a corresponding period in a sequence of consecutive periods of the second clock signal, where n is a non-negative integer.

2. The method of claim 1, wherein forming the digital word comprises filtering the stream of digital bits or symbols.

3. An apparatus for determent the phase of a first clock signal using a second clock signal, comprising:

means for sampling the first clock signal in accordance with the second clock signal to produce a stream of digital bits or symbols wherein a frequency ratio of the first and second clock signals is variable throughout a range including non-integer values; and means for performing postprocessing of the stream of digital bits or symbols to form, from a substantial number of said digital bits or symbols, a digital word indicative of the phase;

wherein each digital bit or symbol of a sequence of consecutive digital bits or symbols represents a number of transitions n of a predetermined polarity of the first clock signal that occurred during a corresponding period in a sequence of consecutive periods of the second clock signal, where n is a non-negative integer.

4. The apparatus of claim 3, wherein said means for postprocessing comprises a digital filter.

5. The apparatus of claim 4, wherein the digital filter employs a weighting function in which different weights are applied to different digital bits or symbols.

6. A method of producing a data stream indicative of the phase of a first clock signal using a second clock signal, comprising sampling the first clock signal in accordance with the second clock signal to form a first stream of digital bits or symbols wherein a frequency ratio of the first clock signal and the second clock signal is variable throughout a range including non-integer values, each digital bit or symbol of a sequence of consecutive digital bit or symbols representing a number of transitions n of a predetermined polarity of the first clock signal that occurred during a corresponding period in a sequence of consecutive periods of the second clock signal, such that processing of the first stream of digital bits or symbols yields as the phase a digital word.

7. The method of claim 6, wherein a frequency difference phase calculation is employed, comprising:
   filtering the first stream of digital bits or symbols to obtain an average ratio of frequencies of the first and second clock signals;
   filtering the first stream of digital bits or symbols to obtain a series of short-term estimates of the ratio of frequencies of the first and second clock signals;
   for each estimate, calculating a difference between the estimate and the average ratio of frequencies and converting the difference to phase increment; and
   accumulating the phase increments to produce a running phase estimate.

8. The method of claim 6, wherein a pre-summation difference phase calculation is employed, comprising:
   producing a first stream of digital words by subtracting from each said digital bit or symbol a ratio of frequencies of the first and second clock signals;
   producing a second stream of digital words by accumulating the first stream of digital words; and
   filtering the second stream of digital words.

9. The method of claim 6, comprising the steps of:
   producing a second stream of digital bits or symbols that result when a reference clock signal is sampled in accordance with said second clock signal;
   subtracting bits or symbols of the second stream of digital bits or symbols from digital bits or symbols of the first stream to produce a third stream of digital bits or symbols; and
   accumulating the third stream of digital bits or symbols to form a fourth stream of digital bits or symbols each having one of the values 1, 0 and −1.

10. The method of claim 9, wherein an integer difference phase calculation method is employed, comprising filtering the fourth stream of digital bits or symbols.

11. The method of claim 9, wherein a clock measure phase calculation is employed, comprising:
   filtering said first stream of digital bits or symbols to produce a first stream of digital words;
   producing a second stream of digital words that result when said reference clock signal is Sigma-Delta modulated in accordance with said second clock signal;
   forming a third stream of digital words by subtracting from digital bits or symbols of said fourth stream of digital bits or symbols respective fractional portions of digital words of said second stream of digital words; and
   combining said stream of digital words and said second stream of digital words.

12. The method of claim 11, wherein filtering is performed using a hyperbolic weighting function.

13. A circuit for producing a data stream indicative of the phase of a first clock signal using a second clock signal, comprising a first input terminal to which the first clock signal is applied, a second input terminal to which the second clock signal is applied, wherein a frequency ratio of the first clock signal and the second clock signal is variable throughout a range including non-integer values, and producing as an output signal a stream of digital bits or symbols, each digital bit or symbol of a sequence of consecutive digital bits or symbols representing a number of transitions n of a predetermined polarity of the first clock signal that occurred during a corresponding period in a sequence of consecutive periods of the second clock signal, such that processing of the stream of digital bits or symbols yields as the phase a digital word.

14. The circuit of claim 13, further comprising:
   a weight generator;
   a first accumulator; and
   a second accumulator;
      wherein the first accumulator receives as an input the stream of digital bits or symbols and produces an output stream of digital symbols or words, the weight generator produces a series of weights, and the second accumulator receives the series of weights and the output stream of digital words and produces a phase estimate.

15. The circuit of claim 14, wherein the second accumulator comprises a hardware multiplier.

16. The circuit of claim 14, wherein said first accumulator comprises a reference pattern generator and said output stream consists of the symbols 1, 0 and −1, and wherein said second accumulator comprises an adder/subtractor.

17. The circuit of claim 13, further comprising:
   a weight generator;
   a first accumulator;
   a second accumulator; and
   a summation block;
      wherein the weight generator produces a series of weights, the first accumulator receives as inputs the stream of digital bits or symbols and the series of weights and produces an output stream of digital words, the second accumulator receives as inputs the stream of digital bits or symbols and produces a second output stream of digital symbols, and the summation block sums outputs from the first accumulator and the second accumulator to produce a phase estimate.

* * * * *